(12) United States Patent
Mathews

(10) Patent No.: US 6,211,078 B1
(45) Date of Patent: Apr. 3, 2001

(54) METHOD OF IMPROVING RESIST ADHESION FOR USE IN PATTERNING CONDUCTIVE LAYERS

(75) Inventor: Viju K. Mathews, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/912,347

(22) Filed: Aug. 18, 1997

(51) Int. Cl.$^7$ .................................................. H01L 21/44
(52) U.S. Cl. ........................... 438/669; 438/720; 438/902
(58) Field of Search .................................... 438/770, 714, 438/958, 688, 669, 636, 671, 685, 720, 902, 952; 257/753, 768

(56) References Cited

U.S. PATENT DOCUMENTS

| | | | |
|---|---|---|---|
| 5,207,868 | * | 5/1993 | Shinohara . |
| 5,219,788 | * | 6/1993 | Abernathey et al. . |
| 5,272,111 | | 12/1993 | Kosaki ................................ 437/192 |
| 5,286,609 | * | 2/1994 | Koh . |
| 5,480,748 | * | 1/1996 | Bakeman, Jr. et al. . |
| 5,763,948 | * | 9/1998 | Sumi .................................... 257/763 |

FOREIGN PATENT DOCUMENTS 6-110198  *  4/1994  (JP) .

OTHER PUBLICATIONS

J-S Jeng, et al., "DUV resist profile improvement on TiN deposited metal layer", Proc. of the SPIE, vol. 2726, pp. 427–36, 1996.*
(Anonymous) "Reconditioning of Titanium Nitride Surface for Good Resist Adhesion" RD 90314056 (abstract), Jun. 1990.*
*Advanced Materials For Optics and Electronics*, "CVD of $SiO_2$ and Related Materials: An Overview", 6, pp. 101–114 (1996).
Dean et al., "Investigation of deep ultraviolet photoresists on TiN substrates", *SPIE*, 2438, pp. 514–528 (1995).
Kubota et al., "Oxidation of TiN thin films in an ion–beam–assisted deposition process", *Applied Surface Science*, 82/83, pp. 565–568 (1994).
Lin et al., "DUV Resist Profile Improvement on TiN Deposited Metal Layer", *SPIE*, 2726, pp. 427–436 (1996).
McIntyre er al., "Uses of ultraviolet/ozone for hydrocarbon removal: Application to surface of complex composition or geometry", *J. Vac. Sci. Technol.*9,pp. 1355–1359 (1991).
Abstract and Article No. 314056, "Reconditioning of titanium Nitride Surfaces for Good Resist Adhnesion" (disclosed anonymously) 2 pgs., Jun. 1990.
Tompkins et al., "Oxidation of TiN in an oxygen plasma asher", *J. Vac. Sci. Technol.*12,pp.2446–2459 (1994).
Vig, "UV/ozone cleaning of surfacws", *J.Vac.Sci. Technol.,* e, pp. 1027–1034 (1985).
Wakamiya et al., "Adhesion Improvement of Photoresist on TiN/A1 Multilayer by Ozone Treatmen", *Jpn. J. Appl. Phys.*,35, pp. 1227–1229 (1996).

* cited by examiner

*Primary Examiner*—Caridad Everhart
(74) *Attorney, Agent, or Firm*—Mueting, Raasch & Gebhardt, P.A.

(57) ABSTRACT

A method for use in patterning a conductive layer of an integrated circuit includes providing a conductive layer to be patterned and then forming a titanium nitride layer on the conductive layer. An oxide region is formed on the titanium nitride layer. A photoresist layer is formed on the oxide region for use in patterning the conductive layer. The oxide region may be formed by oxidation of the titanium nitride layer or by depositing an oxide layer on the titanium nitride layer.

28 Claims, 1 Drawing Sheet

METHOD OF IMPROVING RESIST ADHESION FOR USE IN PATTERNING CONDUCTIVE LAYERS

FIELD

The present invention relates to the use of resist for patterning conductive layers in semiconductor processing. More particularly, the present invention relates to improved adhesion of resist to a titanium nitride layer for use in patterning a layer underlying the titanium nitride layer.

BACKGROUND OF THE INVENTION

In the fabrication of a semiconductor integrated circuit (IC), material is deposited, or otherwise formed, in layers. Some of these layers are then patterned to form the individual devices within the IC. Layers of conductive material (e.g., metal, such as aluminum) formed over the individual devices are patterned to form metal lines. The metal lines provide connections with respect to the individual devices of the IC.

Generally, a conductive layer to be patterned is supported by a substrate during processing. During patterning, a photoresist layer is formed over the conductive layer to be patterned. The photoresist layer is then exposed to ultraviolet radiation as part of a photolithographic process used to perform the patterning. The photoresist layer is exposed such that a desired pattern is imparted to the photoresist layer after its selective removal. The photoresist is patterned to define features having critical dimensions in underlying layers. To remove portions of the photoresist layer (exposed or unexposed, depending on the type of photoresist used), a developer solution is used. The underlying conductive layer to be patterned is, thus, exposed in regions where the photoresist was removed using the developer solution. An etchant is then typically used to remove the underlying conductive layer, resulting in a patterned conductive layer supported by the substrate.

At the interconnect level in the fabrication process, a significantly rough surface topography typically exists due to the numerous patterned layers thereunder. This rough surface topography causes an uneven level of reflection from the conductive layer into the overlying photoresist layer when the photoresist is exposed to ultraviolet radiation. The uneven level of reflection results in poor definition of the pattern in the photoresist layer. Thus, conventionally, to control the amount of reflection from underlying layers, titanium nitride (TiN) is conventionally formed between the underlying layer and the photoresist layer to act as an antireflective layer.

As device density is increasing to meet consumer demands for faster processing of data, the amount of interconnect required between devices is also increasing. To accommodate this increase in the amount of interconnects needed per chip, the pitch (i.e., width) of metal lines and spaces therebetween is being decreased and the interconnects are being formed in an increasing number of layers within the IC. As the pitch tightens, such as, for example, about 0.6 microns and below, adhesion of photoresist to the underlying TiN layer is problematic. As a result of poor photoresist adhesion to the TiN layer, patterning of the underlying conductive layer is also poor, particularly at the interface between the photoresist and the underlying layer. Therefore, there is a need for methods to improve resist adhesion on a TiN layer for use in patterning of underlying conductive layers.

SUMMARY OF THE INVENTION

A method for use in patterning a conductive layer of an integrated circuit in accordance with the present invention includes providing a conductive layer to be patterned and then forming a titanium nitride layer on the conductive layer. The titanium nitride layer is oxidized resulting in an oxide region. The oxide region has a thickness in the range of about 5 nanometers to about 30 nanometers. A photoresist layer is formed on the oxide region.

In various embodiments of the method, the oxide region has a thickness in the range of about 5 nanometers to about 20 nanometers, the oxidation of the titanium nitride layer includes oxidizing the titanium nitride layer at a temperature less than about 400° C., and/or the oxidation the titanium nitride layer includes oxidizing the titanium nitride layer at a pressure in the range of about 10 atmospheres to about 50 atmospheres.

In further embodiments of the method, the oxidation of the titanium nitride layer includes oxidizing the titanium nitride layer using ozone, subjecting the titanium nitride layer to a solution for reaction with the titanium nitride layer, or subjecting the titanium nitride layer to an oxygen ash. Yet further, the photoresist is a non-chemically amplified photoresist.

In a further method for use in patterning a conductive layer of an integrated circuit in accordance with the present invention, the method includes providing a conductive layer to be patterned and then forming a titanium nitride layer on the conductive layer. An oxide layer is then formed on the titanium nitride layer with the oxide layer having a thickness in the range of about 5 nanometers to about 30 nanometers. A photoresist layer is formed on the oxide layer.

In one embodiment of the method, the forming of an oxide layer includes depositing an oxide layer, preferably a silicon dioxide layer. In a further embodiment, the oxide layer has a thickness in the range of about 5 nanometers to about 20 nanometers.

In various embodiments of the present invention, the method includes patterning the conductive layer to a pitch of less than or equal to about 0.6 microns. In other embodiments of the invention, the titanium nitride layer formed on the conductive layer has a thickness of less than about 600 Å.

Further, in accordance with the present invention, an intermediate structure formed during a semiconductor wafer fabrication process is provided. The structure includes a conductive layer on a substrate, a titanium nitride layer on the conductive layer, an oxide region having a thickness in the range of about 5 nanometers to about 30 nanometers on the titanium nitride layer, and a photoresist layer on the oxide region.

DETAILED DESCRIPTION OF THE EMBODIMENTS

Figure 1:
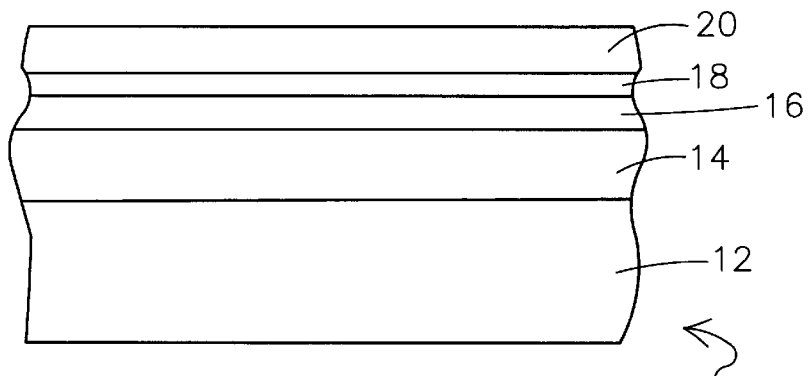
FIG. 1 is a cross-sectional representation of a multilayer stack for use in patterning a conductive layer in accordance with the present invention.

The present invention shall be described with reference to FIGS. 1–3. As shown in the illustrative representation of FIG. 1, a multilayer stack 10 includes a substrate 12 that supports an overlying conductive layer 14, e.g., aluminum, for providing contact to portions of the underlying substrate 12 after patterning of the conductive layer 14. An antireflective layer 16, e.g., a TiN layer, is formed on the conductive layer 14 to provide control of the reflectivity of the underlying layers, including conductive layer 14 and any other layers of substrate 12. An oxidized region 18 is formed on the antireflective layer 16 in accordance with the present invention. The oxidized region 18 may be an oxide layer and/or be formed by oxidation of the TiN layer as further described below.

To pattern the conductive layer 14, the conductive layer 14 is formed on the semiconductor-based substrate 12 by any method for forming conductive layers in semiconductor processing as known to one skilled in the art (e.g., by sputter deposition). It is to be understood that the term substrate, as used herein, includes a wide variety of semiconductor-based structures. Such structures are often used as building blocks within a semiconductor integrated circuit (IC). A substrate can be a single layer of material, such as a silicon wafer. Substrate is also to be understood as including silicon-on-sapphire (SOS) technology, silicon-on-insulator (SOI) technology, doped and undoped semiconductors, epitaxial layers of silicon supported by a base semiconductor, as well as other semiconductor-based structures, including any number of layers including patterned interconnect conductive layers as is well known to one skilled in the art. Furthermore, when reference is made to a substrate herein, previous process steps may have been utilized to form regions/junctions/devices in a base semiconductor structure.

The thickness of the conductive layer 14 formed on the substrate 12 depends on the various parameters of the IC being processed. For example, the thickness depends on the device density of the IC. Further, for example, the thickness of the conductive layer may be in the range of about 100 nanometers to about 500 nanometers for IC's having features sizes of tight pitch, i.e., less than or equal to about 0.6 microns. The conductive material may be any conductive material typically used in semiconductor processing, and in particular those used for interconnect functions. For example, the conductive layer may be aluminum, copper, tungsten, any other interconnect conductive material as known to those skilled in the art, or alloys thereof. Further, the conductive layer 14 may be formed of more than one layer. For example, the conductive layer 14 may be a first layer of titanium silicide or other metal silicide with a second layer of aluminum formed thereover. Yet further, the conductive layer 14 may be one of a plurality of conductive layers in a multi-level interconnect structure.

After the conductive layer 14 to be patterned is formed on the substrate 12, the antireflective layer 16 is formed thereon. Preferably, the antireflective layer 16 is a titanium nitride (TiN) layer as well known to one of ordinary skill in the art. Hereinafter, the present invention shall be described with reference to the antireflective layer being TiN. The TiN layer 16 can be formed in various manners. For example, the titanium nitride layer can be formed by evaporating the titanium in a nitrogen ambient atmosphere, by reactively sputtering titanium in an argon and nitrogen atmosphere, by sputtering from a titanium nitride target in an inert ambient atmosphere, by sputter depositing titanium in an argon ambient and converting it to titanium nitride in a separate plasma nitridation step, by chemical vapor deposition, or any other method known to one skilled in the art.

The thickness of the TiN layer 16 formed typically depends on a number of factors. For example, the thickness of the TiN layer 16 will depend on the thickness and type of the underlying conductive layer 14, e.g., the reflective characteristics of the underlying conductive layer 14. Further, for example, to achieve patterning at a pitch of less than or equal to about 0.6 microns, a particular thickness of TiN may be required. Such a TiN thickness is typically about 300 Å or more for patterning an aluminum conductive layer. In accordance with the present invention, with use of an oxidation region as described herein formed relative to the TiN layer 16, such a minimum thickness for achieving good patterning of the conductive layer 14 at a pitch of less than or equal to 0.6 microns, may not be necessary. The present invention is beneficial when the TiN thickness is less than about 600 Å, and particulary more beneficial when the TiN thickness is less than about 300 Å.

The oxide region 18 is then formed relative to the TiN layer 16. The oxide region 18 may be formed by oxidation of the TiN layer 16 or the oxide region 18 may be an oxide layer deposited or otherwise formed on the TiN layer 16. When the oxide region 18 is referred to as being formed on the TiN layer 16, such formation is meant to encompass both depositing, or otherwise forming, an oxide layer (e.g., silicon dioxide ($SiO_2$)) on the TiN layer, as well as incorporating oxygen into the TiN layer (e.g., by ozone ($O_3$) treatment, oxygen ash, etc.).

The formation of oxide region 18 is performed at an intermediate stage of the semiconductor processing for the IC, e.g., interconnect processing, when processing temperatures are an important concern. Further, the step of forming an oxide region is an additional step in the patterning of the conductive layer 14 that is not conventionally utilized. Therefore, in accordance with the present invention, the formation of the oxide region 18 on the TiN layer 16 is performed in a manner that addresses such concerns. Preferably, the formation of the oxide region 18 is performed at a process temperature of less than about 400° C., more preferably less than about 300° C., and most preferably less than about 200° C. In addition, to limit the time necessary to carry out the additional step of forming an oxide region 18 on the TiN layer 16, the thickness of the oxide region is preferably in the range of about 5 nanometers to about 30 nanometers, more preferably in the range of about 5 nanometers to about 20 nanometers.

Although any suitable method can be utilized to deposit, or otherwise form, the oxide region 18 on the TiN layer 16 (e.g., thermal furnace oxidation, rapid thermal furnace oxidation) the following methods are preferably utilized. With respect to the oxidation of or incorporation of oxygen into the TiN layer 16 to form oxide region 18, preferably one of the following processes is used: high pressure thermal oxidation, plasma-enhanced oxidation (i.e., an oxygen plasma ash), ozone treatment, or chemical processing to grow an oxide (e.g., $TiO_2$, $Ti_xN_yO_z$) layer on the TiN layer.

With respect to high pressure thermal oxidation, a high pressure oxidation system is utilized to grow the oxide region 18. Preferably, the processing temperature is maintained at a level less than about 400° C., by controlling the pressure of the system. For example, the pressure of the system may be controlled within the range of about 10 atmospheres to about 50 atmospheres to achieve a temperature level of less than about 400° C. Any suitable high pressure oxidation processing system may be used.

With respect to plasma enhanced oxidation, the oxide growth rate can be increased at a low temperature. Typically, the structure to be oxidized is placed in a plasma under an applied electric field that enhances the migration of atomic oxygen toward the TiN layer 16. Such plasma enhanced processing as known to one skilled in the art can be carried out at typically about 300° C. or less.

The TiN layer 16 may also be exposed to ozone for forming the oxide region 18. The ozone may be created by any known method, such as, for example, a corona discharge method, ultraviolet radiation activation of oxygen, etc. Ozone treatment forms the oxide within the preferred temperature ranges given above.

Further, the TiN layer 16 may be subjected to a chemical solution such as, for example, hydrogen peroxide. Such solutions react with the TiN layer to form a chemically grown oxide region 18. This chemical solution growth technique is also a low temperature technique.

With respect to the oxidation processes described above, when the titanium nitride layer is oxidized, the concentration of oxygen atoms in the oxidized region 18 between the TiN layer 16 and the photoresist layer 20 is preferably in the range of about 20 percent to about 60 percent of the oxidized region 18, preferably about 40 percent.

With respect to the formation, e.g., deposition, of an oxide layer on the TiN layer 16 to form oxide region 18, preferably chemical vapor deposition is used. For example, chemical vapor deposition (CVD) can be utilized to deposit a silicon dioxide layer or any other oxide layer that improves the adhesion of photoresist to the underlying layers. Preferably, a plasma enhanced CVD process is utilized to obtain the benefits of a lower processing temperature, although photo-assisted processes and TEOS/ozone atmospheric pressure CVD processes also take advantage of such low temperatures. With respect to such preferable CVD processes, the silicon dioxide layer may be deposited at temperatures less than about 400° C., and even about 200° C. or below. For example, silicon dioxide layers can be formed by the reaction of silane (or its halides) at about 350° C. with $O_2$, $N_2O$, or $CO_2$ in a glow discharge. It should be readily apparent to one skilled in the art that the oxide deposited is not limited to silicon dioxide, but that other doped or undoped oxides may be deposited for forming oxide region 18. CVD of silicon dioxide is described in "CVD of $SiO_2$ and Related Materials: An Overview," *Advanced Materials For Optics and Electronics*, Vol. 6, pp. 101–114 (1996).

Although various methods of forming the oxide region 18 are described above, there are various other methods available. The present invention is not limited to any particular method, but is limited only as described in the accompanying claims. For example, one skilled in the art will recognize that the oxide region 18 may also be formed by depositing an oxidizable layer, e.g., silicon, titanium, aluminum or any other oxidizable material, and thereafter, oxidizing the layer, such as with a low temperature oxidation process as described above.

With respect to the processes as described above, preferably the plasma enhanced CVD process is used as the oxide region having a thickness in the ranges given above can be time efficiently deposited. For example, such a process can form the oxide region 18 having a thickness of about 30 nanometers in a time period of less than about 1 minute (e.g., at 200° using $SiH_4/N_2O$ yields approximately 500 Å/minute).

The oxygen atom concentration in the oxide region 18 at the interface between the TiN layer 16 and the photoresist layer 20 when a deposition process is used in accordance with the present invention is preferably in the range of about 80 percent to about 60 percent, preferably about 70 percent.

After the oxide region 18 is formed on the TiN layer, the photoresist layer 20 is deposited thereon resulting in the multilayer stack 10 as shown in FIG. 1. The thickness of the photoresist layer depends on the type of photoresist used, among other variables. Preferably, the type of photoresist used is not chemically amplified (CA). Thus, photoresists according to the present invention are preferably exposed at wavelengths of i-line (i.e., 365 nanometers or greater) because CA resists are typically not used at such higher wavelengths. Preferable photoresists, thus, include any solvent based organic material having a photoactive component sensitivity to 365 nanometer wavelength, such as the resists SPR 950, OIR 620, and 897-10I. The thickness of the photoresist layer 20 can be, for example, about 8000 Å to about 10,000 Å. Any method as known by those skilled in the art can be utilized to deposit, or otherwise form, the photoresist layer 20.

Figure 3:
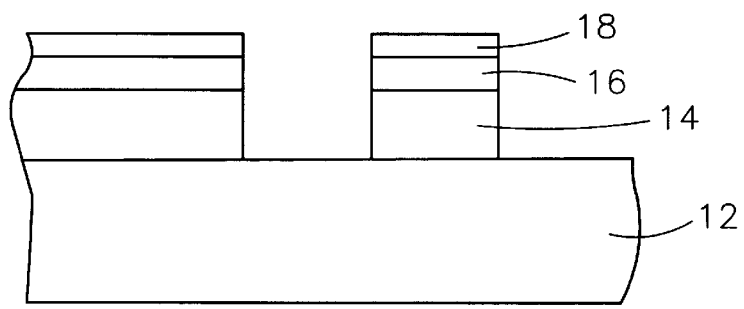
FIG. 3 is a cross-sectional representation of the stack of FIG. 2 having the conductive layer patterned in accordance with the present invention.

Although this invention is applicable for use wherever improvement in the adhesion of photoresist to an underlying antireflective layer, e.g., TiN layer is needed, this invention is particularly advantageous when patterning underlying metal layers, such as aluminum, to a pitch of less than or equal to about 0.6 microns (i.e., pitch (P) being the width of a line and space as shown in FIG. 3.) The critical dimension of line widths within the pitch for which the present invention is particularly beneficial may vary from about 0.1 microns to about 0.5 microns, preferably about 0.2 to about 0.4. However, the present invention is particularly beneficial for defining any features having a critical dimension of less than or equal to about 0.6 microns, preferably those features having a critical dimension of about 0.2 microns to about 0.4 microns. At such small feature sizes, adhesion of photoresist to TiN is typically problematic.

Figure 2:
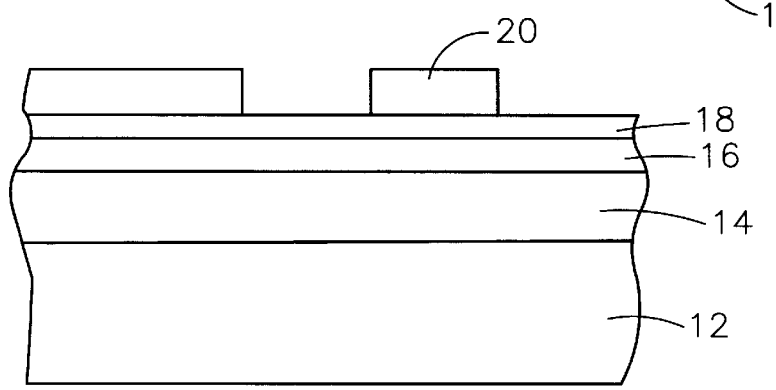
FIG. 2 is a cross-sectional representation of the stack of FIG. 1 having the photoresist patterned in accordance with the present invention.

As shown in FIG. 2, with the multilayer stack 10 formed, the photoresist layer 20 can be patterned as desired to define features having critical dimensions in the underlying layers. As known to those skilled in the art, photolithography is utilized to pattern the photoresist layer 20. Generally, in the photolithographic process, first, an optical mask is positioned between a radiation source and the photoresist layer 20. The radiation source can be, for example, visible light or ultraviolet radiation. Then, the image is reproduced by exposing the photoresist layer 20 to radiation through the optical mask. Portions of the mask contain an opaque layer, such as, for example, chromium, that prevents exposure of the underlying photoresist. Remaining portions of the mask are transparent, allowing exposure of the underlying photoresist. Depending on the type of photoresist utilized (i.e., negative type or positive type), exposed photoresist is either removed when the substrate is contacted with a developer solution, or the exposed photoresist becomes more resistant to dissolution in the developer solution. Thus, a patterned photoresist layer 20 is formed as generally represented in FIG. 2.

After the photoresist layer 20 has been patterned, the exposed portions of the underlying oxide region 18, the TiN layer 16, and the conductive layer 14 are selectively removed as shown in FIG. 3 using any conventional removal process for such materials. With the oxide region 18 promoting adhesion of the photoresist layer 20 to the TiN layer 16, improved patterning of the conductive layer 14 results.

Such underlying layers may be removed using any known etching process for removing the layers. For example, when the oxide region is a deposited silicon dioxide, the silicon dioxide, TiN, and conductive layer, e.g., aluminum, can be removed by a dry etch using a chlorine-containing etchant such as, for example, $Cl_2$, $BCl_3$, $CCl_4$, $SiCl_4$ and combinations thereof. A phosphoric acid clean is typically performed thereafter to remove any residual polymer. Further, for example, when the oxide region is an oxidized TiN layer (e.g., titanium oxide or $Ti_xN_yO_z$), then the oxide region may be removed by a dry etch using a fluorine-containing etchant, such as, for example, $SF_6$, $CF_4$, $NF_3$, or any combination thereof. Further, for example, a combination of a fluorine containing etchant and a chlorine containing etchant may also be used. It should be readily apparent that various etchants may be used and the present invention is in no manner limited to any particular etchant listed. With the conductive layer 14 patterned, the photoresist is conventionally removed, such as with use of an oxygen ash, resulting in the structure shown in FIG. 3.

All references and patents disclosed herein are incorporated by reference in their entirety, as if each were individually incorporated. Various modifications and alterations of this invention will become apparent to those skilled in the art without departing from the scope of the invention, and it should be understood that this invention is not to be unduly limited to the illustrative embodiments and processes set forth herein.

What is claimed is:

1. A method for use in patterning a conductive layer of an integrated circuit, the method comprising the steps of:
   providing a conductive layer;
   forming a titanium nitride layer on the conductive layer;
   oxidizing the titanium nitride layer resulting in an oxide region of $Ti_xN_yO_z$ having a thickness in the range of about 5 nanometers to about 20 nanometers; and
   forming a photoresist layer on the oxide region.

2. The method according to claim 1, wherein the step of oxidizing the titanium nitride layer includes oxidizing the titanium nitride layer at a temperature less than about 400° C.

3. The method according to claim 2, wherein the step of oxidizing the titanium nitride layer includes oxidizing the titanium nitride layer at a pressure in the range of about 10 to about 50 atmospheres.

4. The method according to claim 1, wherein the photoresist is a non-chemically amplified photoresist.

5. The method according to claim 1, wherein the step of providing a conductive layer includes providing a layer of aluminum.

6. A method for use in patterning a conductive layer of an integrated circuit, the method comprising the steps of:
   providing a conductive layer;
   forming a titanium nitride layer on the conductive layer;
   oxidizing the titanium nitride layer resulting in an oxide region of $Ti_xN_yO_z$ having a thickness in the range of about 5 nanometers to about 30 nanometers, wherein the step of oxidizing the titanium nitride layer includes oxidizing the titanium nitride layer at a pressure in the range of about 10 to about 50 atmospheres; and
   forming a photoresist layer on the oxide region.

7. A method for use in patterning a conductive layer of an integrated circuit, the method comprising the steps of:
   providing a conductive layer;
   forming a titanium nitride layer on the conductive layer;
   oxidizing the titanium nitride layer resulting in an oxide region of $Ti_xN_yO_z$ having a thickness in the range of about 5 nanometers to about 30 nanometers, wherein the step of oxidizing the titanium nitride layer includes oxidizing the titanium nitride layer using ozone; and
   forming a photoresist layer on the oxide region.

8. A method for use in patterning a conductive layer of an integrated circuit, the method comprising the steps of:
   providing a conductive layer;
   forming a titanium nitride layer on the conductive layer;
   oxidizing the titanium nitride layer resulting in an oxide region of $Ti_xN_yO_z$ having a thickness in the range of about 5 nanometers to about 30 nanometers, wherein the step of oxidizing the titanium nitride layer includes reacting the titanium nitride layer with a solution; and
   forming a photoresist layer on the oxide region.

9. A method for use in patterning a conductive layer of an integrated circuit, the method comprising the steps of:
   providing a conductive layer;
   forming a titanium nitride layer on the conductive layer;
   oxidizing the titanium nitride layer resulting in an oxide region of $Ti_xN_yO_z$ having a thickness in the range of about 5 nanometers to about 30 nanometers, wherein the step of oxidizing the titanium nitride layer includes subjecting the titanium nitride layer to an oxygen ash; and
   forming a photoresist layer on the oxide region.

10. A method for use in patterning a conductive layer of an integrated circuit, the method comprising the steps of:
    providing a conductive layer;
    forming a titanium nitride layer on the conductive layer;
    forming an oxide layer on the titanium nitride layer, the oxide layer having a thickness in the range of about 5 nanometers to about 20 nanometers; and
    forming a photoresist layer on the oxide layer.

11. The method according to claim 10, wherein the step of forming an oxide layer includes depositing an oxide layer on the titanium nitride layer.

12. The method according to claim 11, wherein the oxide layer is a silicon dioxide layer.

13. The method according to claim 10, wherein the step of forming the oxide layer includes forming an oxidizable layer on the titanium nitride layer and thereafter oxidizing the oxidizable layer.

14. The method according to claim 10, wherein the step of forming the oxide layer includes depositing the oxide layer at a temperature less than about 400° C.

15. The method according to claim 10, wherein the photoresist is a non-chemically amplified photoresist.

16. The method according to claim 10, wherein the step of providing a conductive layer includes providing a layer of aluminum.

17. A method for forming a patterned conductive layer, the method comprising the steps of:
    providing a conductive layer;
    forming a titanium nitride layer on the conductive layer;
    forming an oxide layer having a thickness in the range of about 5 nanometers to about 20 nanometers on the titanium nitride layer at a temperature less than about 400° C.; and
    forming a photoresist layer on the oxide layer to define features in the conductive layer having a pitch of less than or equal to about 0.6 microns.

18. The method according to claim 17, wherein the step of forming an oxide layer includes depositing an oxide layer on the titanium nitride layer.

19. The method according to claim 18, wherein the oxide layer is a silicon dioxide layer.

20. The method according to claim 18, wherein the oxygen concentration in the oxide layer is at least about 60 percent.

21. The method of claim 17, wherein the step of forming an oxide layer includes incorporating oxygen into a portion of the titanium nitride layer.

22. The method according to claim 21, wherein the oxygen concentration in the oxide layer is at least about 20 percent.

23. The method of claim 17, wherein the step of forming an oxide layer includes thermally oxidizing the titanium nitride layer at a pressure in the range of about 10 atmospheres to about 50 atmospheres.

24. The method of claim 17, wherein the photoresist includes a non-chemically amplified photoresist.

25. A method for forming a patterned conductive layer, the method comprising the steps of:

providing a conductive layer;

forming a titanium nitride layer on the conductive layer;

forming an oxide layer having a thickness in the range of about 5 nanometers to about 20 nanometers on the titanium nitride layer;

forming a photoresist layer on the oxide layer;

patterning the photoresist layer resulting in exposed portions of the oxide layer; and removing the exposed portions of the oxide layer, and portions of the titanium nitride layer and portions of conductive layer underlying the exposed portions.

26. A method for forming a patterned conductive layer, the method comprising the steps of:

providing a conductive layer;

forming a titanium nitride layer on the conductive layer, the titanium nitride layer having a thickness of less than about 600 Å;

depositing an oxide layer on the titanium nitride layer, the oxide layer having a thickness in a range of about 5 nanometers to about 20 nanometers;

forming a photoresist layer on the oxide layer; and defining at least one feature in the conductive layer, the at least one feature having a critical dimension less than or equal to about 0.6 microns.

27. The method according to claim 26, wherein the defining step includes patterning the photoresist layer to expose portions of the underlying titanium nitride layer and conductive layer.

28. The method according to claim 27, wherein the titanium nitride layer has a thickness of less than about 300 Å.

* * * * *